United States Patent [19]
Yoshida et al.

[11] Patent Number: 5,057,454
[45] Date of Patent: Oct. 15, 1991

[54] PROCESS FOR PRODUCING OHMIC ELECTRODE FOR P-TYPE CUBIC SYSTEM BORON NITRIDE

[75] Inventors: Katsuhito Yoshida; Kazuwo Tsuji, both of Hyogo, Japan

[73] Assignee: Sumitomo Electric Industries, Ltd., Osaka, Japan

[21] Appl. No.: 601,626

[22] Filed: Oct. 23, 1990

[30] Foreign Application Priority Data

Oct. 23, 1989 [JP] Japan .................................. 1-276346

[51] Int. Cl.$^5$ ......................................... H01L 21/283
[52] U.S. Cl. .................................. 437/184; 437/189; 437/192; 148/DIG. 113
[58] Field of Search ...................... 437/184, 189, 192; 748/DIG. 113; 357/65, 67, 71

[56] References Cited

U.S. PATENT DOCUMENTS

| | | | |
|---|---|---|---|
| 3,769,694 | 11/1973 | Collins et al. | 437/184 |
| 3,850,688 | 11/1974 | Halt | 437/184 |
| 4,875,967 | 10/1989 | Mishima et al. | 148/DIG. 113 |

FOREIGN PATENT DOCUMENTS

| | | | |
|---|---|---|---|
| 56-29381 | 3/1981 | Japan | 437/184 |
| 8100932 | 4/1981 | World Int. Prop. O. | 437/184 |

OTHER PUBLICATIONS

Hasenberg, T. C., et al., "An Improved ...", *J. Appl. Phys.*, vol. 61, No. 2, 15 Jan. 1987, pp. 808–809.
Keramidas, V. G., et al., "Metallurgical Interactions ...", *Thin Solid Films*, vol. 96, 1982, pp. 347–363.
Piotrowska, A., et al., "Gold-Based ...", *Thin Solid Films*, vol. 130, 1985, pp. 231–236.

*Primary Examiner*—Brian E. Hearn
*Assistant Examiner*—T. N. Quach
*Attorney, Agent, or Firm*—Sughrue, Mion, Zinn, Macpeak & Seas

[57] ABSTRACT

A process for producing an ohmic electrode for p-type cBN is disclosed, which process comprises the steps of: providing a thin alloy film composed of Au and Be, the weight ratio of Be being from 0.1 to 15% by weight, on p-type cBN; providing a thin film of a metal selected from Ni, Cr, Mo, and Pt on the thin alloy film; and subjecting the p-type cBN having the films thus provided to a heat-treatment in an inert gas or in vacuo at a temperature of from 350° C. to 600° C.

14 Claims, 1 Drawing Sheet

PROCESS FOR PRODUCING OHMIC ELECTRODE FOR P-TYPE CUBIC SYSTEM BORON NITRIDE

FIELD OF THE INVENTION

The present invention relates to a process for producing an ohmic electrode for p-type cubic system boron nitride.

BACKGROUND OF THE INVENTION

Hitherto, for producing an electrode for a semiconductor cubic system boron nitride (hereinafter referred to as "cBN"), a silver paste is used as described in e.g., in *Appl. Phys. Lett.*, vol. 53(11), Sept. 12, 1988, pp. 962–964 but a technique of producing an ohmic electrode for a semiconductor cBN has not yet been developed at present.

In a conventional process for producing an electrode using a silver paste, a contact resistance is large and also the resistance characteristics at passing electric current are unstable. Furthermore, a silver paste shows a poor wetting property with cBN as well as there is a problem that the adhesive strength is weak, whereby the electrode is liable to be separated from the crystal. Accordingly, it is difficult to produce a semiconductor using a cBN crystal.

SUMMARY OF THE INVENTION

In such circumstances, as the result of investigations for establishing a technique of forming an electrode having a sufficient adhesive strength to a semiconductor cBN and a good low resistance, the present inventors have succeeded in accomplishing the present invention.

An object of the present invention is to provide a flat p-type cBN electrode having good ohmic characteristics which is effectively utilized, e.g., for the preparation of semiconductor devices using a cBN crystal.

Other objects and effects of the present invention will be apparent from the following description.

The present invention relates to a process for producing an ohmic electrode for p-type cBN, which comprises the steps of: providing a thin alloy film comprising Au and Be, the weight ratio of Be being from 0.1 to 15% by weight, on p-type cBN; providing a thin film of a metal selected from Ni, Cr, Mo, and Pt on the thin alloy film; and subjecting the p-type cBN having the thin films thus provided to a heattreatment in an inert gas or in vacuo at a temperature of from 350° C. to 600° C.

DETAILED DESCRIPTION OF THE INVENTION

Figure 1:
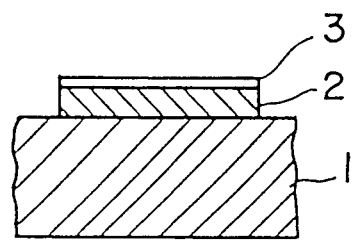
FIG. 1 is a schematic sectional view showing an ohmic electrode produced by the process of the present invention.

Referring to FIG. 1 showing a schematic sectional view of the electrode produced by the process of the present invention, one embodiment of the process for producing an ohmic electrode according to the present invention is explained.

That is, by referring to FIG. 1, the process of the present invention may comprise a step of providing a thin Au-Be alloy film 2 onto the surface of a p-type cBN crystal 1 by vapor deposition, a step of providing a thin film 3 of a metal selected from Ni, Cr, Mo, and Pt onto the thin Au-Be alloy film by vapor deposition, and a step of heat-treating the p-type cBN having provided thereon the aforesaid thin Au-Be alloy film 2 and the thin film 3 of a metal selected from Ni, Cr, Mo, and Pt at a temperature of from 350° C. to 600° C., preferably from 400° to 550° C., and more preferably from 450° to 500° C.

The heat treatment is conducted in an inert gas or in vacuo. Preferred examples of the inert gas include nitrogen and argon. The pressure of the inert gas may be 1 atm. When the heat treatment is conducted in vacuo, the pressure is selected in such a manner that the metal or alloy film is not oxidized, and is preferably $10^{-5}$ Torr or less. The heat treatment is generally conducted for from 5 to 60 minutes, preferably from 5 to 30 minutes, and more preferably from 10 to 20 minutes.

The method for providing the thin Au-Be alloy film and the thin film of Ni, Cr, Mo, or Pt is not particularly limited, and may be vapor deposition or sputtering. The vapor deposition method is preferably employed in view of the production cost.

Conventionally, materials showing an ohmic property by the junction with a p-type cBN crystal had not been known. The present inventors have investigated on materials having ohmic characteristics and as the result thereof, it has been found that an Au-Be alloy has an ohmic property by the junction with a p-type cBN crystal. However, since the wetting property of the cBN crystal with the Au-Be alloy is poor, if the thin film of the Au-Be alloy is vapor deposited on the cBN crystal followed by heating to form alloy, the electrode aggregates in streak like, whereby an electrode having a desired form can not be formed. Thus, after vapor depositing a thin film of a metal selected from Ni, Cr, Mo, and Pt onto the thin Au-Be alloy film, alloying is conducted, whereby the wetting property of the Au-Be alloy is improved to solve the aforesaid problem caused by the poor wetting property, and an ohmic electrode having a desired form can be obtained. Among Ni, Cr, Mo, and Pt, Ni and Cr are preferably used, and Ni is more preferably used in the present invention.

In the present invention, the content of Be in the Au-Be alloy is from 0.1 to 15% by weight, preferably from 0.5 to 10% by weight, and more preferably from 0.5 to 5% by weight. If the content of Be is less than 0.1% by weight, the electrode obtained does not show a good ohmic property, while if the content is over 15% by weight, a thin alloy film having a sufficient junction strength with the cBN crystal is not obtained.

The thickness of the aforesaid thin film of Ni, Cr, Mo, or Pt having a function of inhibiting the aggregation of the Au-Be alloy film is generally from 200 to 2,000 Å, preferably from 200 to 1,000 Å, and more preferably from 300 to 800 Å.

The thickness of the thin Au-Be alloy film is generally from 1,000 Å to 1 μm, preferably from 1,000 to 5,000 Å, and more preferably from 1,000 to 3,000 Å.

EXAMPLE

A thin Au-Be alloy film containing 1.5% by weight of Be and having a thickness of about 2,000 Å was vacuum vapor deposited on a p-type cBN crystal and then a thin Ni film having a thickness of about 500 Å is further vapor deposited thereon. The vacuum vapor deposition was conducted under a pressure of $2 \times 10^{-6}$ Torr. The crystal having the coated films was heat-treated for 10 minutes in an inert gas atmosphere (nitrogen, 1 atm) at 465° C. The electrode thus formed did not cause the phenomenon of streak like aggregation.

Figure 2:
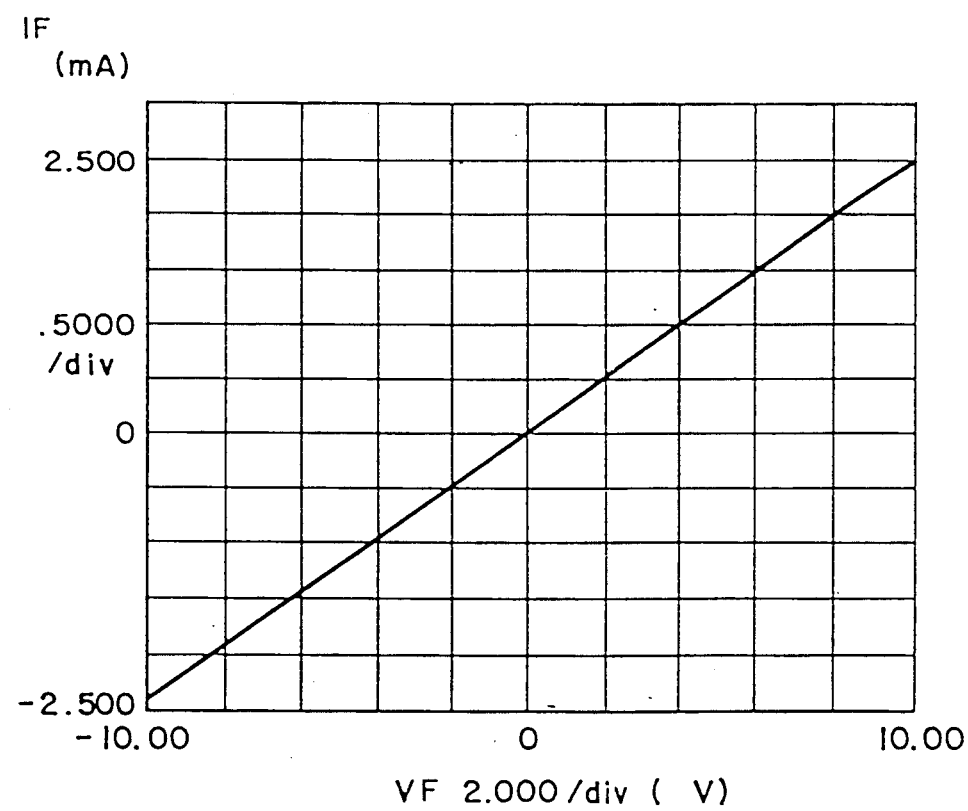
FIG. 2 is a graph showing the measurement result of the current voltage characteristics of p-type cBN using the ohmic electrode produced in the example of the present invention.

The current-voltage characteristics of the electrode of the present invention were measured as follows: On both sides of a p-type cBN crystal, the electrodes of the present invention were produced in the same manner as above. Au lead wires were bonded onto the thin Ni films of both the electrodes, and a direct current of from $-10$ to $+10$ V was applied between both the electrodes. The current-voltage relationship obtained is shown in FIG. 2 in which the abscissa indicates the voltage and the ordinate indicates the current. As shown in FIG. 2, the good ohmic characteristics were obtained.

As described above, according to the present invention, a flat (i.e., without the streak-like aggregation) p-type cBN electrode having good ohmic characteristics are obtained and hence the present invention is effectively utilized for the preparation of semiconductor devices using a cBN crystal.

While the invention has been described in detail and with reference to specific examples thereof, it will be apparent to one skilled in the art that various changes and modifications can be made therein without departing from the spirit and scope thereof.

What is claimed is:

1. A process for producing an ohmic electrode for p-type cBN, which comprises the steps of: providing a thin alloy film composed of Au and Be, the weight ratio of Be being from 0.1 to 15% by weight, on p-type cBN; providing a thin film of a metal selected from Ni, Cr, Mo, and Pt on said thin alloy film; and subjecting said p-type cBN having said films thus provided to a heat-treatment in an inert gas or in vacuo at a temperature of from 350° C. to 600° C.

2. A process as claimed in claim 1, wherein the provision of said thin alloy film and said thin metal film is carried out by a vacuum vapor deposition.

3. A process as claimed in claim 1, wherein said heat-treatment is conducted at a temperature of from 400° to 550° C.

4. A process as claimed in claim 3, wherein said heat-treatment is conducted at a temperature of from 450° to 500° C.

5. A process as claimed in claim 1, wherein the thickness of said thin film of a metal selected from Ni, Cr, Mo, and Pt is from 200 to 2,000 Å.

6. A process as claimed in claim 5, wherein the thickness of said thin film of a metal selected from Ni, Cr, Mo, and Pt is from 200 to 1,000 Å.

7. A process as claimed in claim 6, wherein the thickness of said thin film of a metal selected from Ni, Cr, Mo, and Pt is from 300 to 800 Å.

8. A process as claimed in claim 1, wherein the thickness of said thin alloy film composed of Au and Be is from 1,000 Å to 1 μm.

9. A process as claimed in claim 8, wherein the thickness of said thin alloy film composed of Au and Be is from 1,000 to 5,000 Å.

10. A process as claimed in claim 9, wherein the thickness of said thin alloy film composed of Au and Be is from 1,000 to 3,000 Å.

11. A process as claimed in claim 1, wherein the weight ratio of Be in said thin alloy film composed of Au and Be is from 0.5 to 10% by weight.

12. A process as claimed in claim 11, wherein the weight ratio of Be in said thin alloy film composed of Au and Be is from 0.5 to 5% by weight.

13. A process as claimed in claim 1, wherein said thin film of a metal is selected form Ni and Cr.

14. A process as claimed in claim 13, wherein said thin film of a metal is Ni.

* * * * *